United States Patent
Daubigny (10) Patent No.: US 8,457,321 B2
(45) Date of Patent: Jun. 4, 2013

(54) ADAPTIVE AUDIO OUTPUT

(75) Inventor: Lise Daubigny, Ottignies (BE)

(73) Assignee: NXP B.V., Eindhoven (NL)

( * ) Notice: Subject to any disclaimer, the term of this patent is extended or adjusted under 35 U.S.C. 154(b) by 589 days.

(21) Appl. No.: 12/813,294

(22) Filed: Jun. 10, 2010

(65) Prior Publication Data

US 2011/0305346 A1    Dec. 15, 2011

(51) Int. Cl.
  *H03G 3/20*    (2006.01)
  *H04R 5/00*    (2006.01)

(52) U.S. Cl.
  USPC .............................................. 381/57; 381/28

(58) Field of Classification Search
  USPC ................ 381/106, 108, 57, 58, 59, 321, 102
  See application file for complete search history.

(56) References Cited

U.S. PATENT DOCUMENTS

| 5,434,922 A | 7/1995 | Miller et al. |
| 5,950,156 A | 9/1999 | Ueno et al. |
| 7,469,051 B2 * | 12/2008 | Sapashe et al. ............... 381/104 |
| 2004/0162720 A1 | 8/2004 | Jang et al. |

FOREIGN PATENT DOCUMENTS

| EP | 1619793 A1 | 1/2006 |
| FR | 2890280 A1 | 3/2007 |
| WO | 95/02288 A1 | 1/1995 |
| WO | 20061125061 A1 | 11/2006 |

* cited by examiner

*Primary Examiner* — Duc Nguyen
*Assistant Examiner* — Anita Masson (57) ABSTRACT

Devices, apparatus, methods, circuits and processors are implemented for control of audio signals. Consistent with one such apparatus, a processor circuit is configured and arranged to determine, for a perceived loudness algorithm that outputs audio signal levels, a common point corresponding to a particular background noise level at which the levels of the audio signal levels are independent of a volume setting that corresponds to desired perceived loudness, and to determine an audio signal level from the perceived loudness algorithm in response to a background noise signal, a volume setting signal, and the common point. An audio signal level output circuit is configured and arranged to provide an audio signal at the determined audio signal level.

22 Claims, 7 Drawing Sheets

ADAPTIVE AUDIO OUTPUT

Aspects of the present disclosure relate generally to adjusting an audio signal's strength prior to the signal being outputted, through a speaker for example, to maintain the perceived loudness of the audio signal experienced by the listener.

Aspects of the present disclosure relate to automated compensation for additive noise in connection with a sound-producing device. In particular, the present disclosure presents automated circuits and methods that adjust an output sound level to match a desired perceived volume level for a current level of additive noise. For instance, an audio device with a volume control can be configured to provide an output sound level adjustable by a volume setting. The output sound level when there is not additive noise can be considered the desired perceived sound level. In response to the presence of additive noise, the actual sound level is adjusted so that the perceived sound level is consistent with the desired decibel sound level. Particular aspects of the present disclosure relate to the particular algorithms and related circuit or methods for providing this automated adjustment.

In connection with a particular embodiment of the present disclosure, it has been discovered that there exists a mathematical relationship between a desired perceived sound level, the actual sound level and additive/background noise. One aspect of the relationship that has been discovered relates to a mathematical common point which exists for a range of desired perceived sound levels. Representing each desired perceived sound level as a separate function, there exists a noise level at which the actual sound level is common for each of the separate functions. Accordingly, aspects of the present disclosure use this common point of noise level and actual sound level in determining, adjusting or otherwise controlling the automated adjustment of the actual audio sound level.

In certain embodiments of the present disclosure, an audio signal is provided that represents the sound to be generated. The audio signal is adjusted as a function of the additive noise level to produce sound at the desired perceived sound level. This adjustment to the audio signal can thereby maintain a perceived loudness for a particular volume setting. This adjustment can be graphed on a linear plot as a line or curve radiating from a common point shared by the lines/curves associated with each possible volume setting. The common point is mathematically determined and thus, it is possible to have negative values for the negative additive noise level and the negative audio signal level. An algorithm can be developed from the coordinates of the common point. This algorithm can approximate the relationship between the background noise level and the actual sound level (represented by the level of the adjusted audio signal) and so can be used to maintain a perceived loudness of the actual sound.

In certain embodiments of the present disclosure a single algorithm can be used for a plurality of volume settings. The same equation can be used regardless of the volume setting. Each line (or curve) has a different slope which is described by the common point and the volume setting corresponding to the perceived loudness to be maintained. An example equation resulting from the relationship can be described by a linear equation that describes a set of lines passing through the common point and the actual sound level at zero additive noise, which should also coincide with the desired perceived sound level (e.g., because no adjustment should be necessary where there is no additive noise).

An example equation resulting from the relationship can be described by the linear equation:

$$y = \frac{UVc - UVi}{NLc} X + UVi.$$

The coordinates of the common point, $UVc$ and $NLc$, are used in the equation, as well as the volume setting corresponding to the perceived loudness to be maintained, $UVi$. The coordinates of the common point represent the audio signal level ($UVc$) and background noise level ($NLc$) describing the location of the common point. The value of $UVc$ is the y-coordinate of the common point, and $NLc$ is the x-coordinate of the common point when audio level is on the y-axis and background noise level is on the x-axis.

In connection with an example embodiment, an apparatus includes a background noise input, and a volume setting input, a processor, and an audio signal level output. The processor is configured and arranged to determine an actual sound level (represented by an audio signal level) that corresponds to a desired perceived sound level set by a volume setting control or signal. The processor receives a background noise signal from the background noise input and a plurality of volume settings signals from the volume setting input. The processor determines a common point corresponding to a particular background noise level resulting in an audio signal level that is substantially independent of the volume setting signals for a perceived loudness algorithm. For instance, the common point represents an intersection point for multiple volume settings levels (desired perceived sound levels). This common point can be described on an XY plot having additive noise as one axis and the actual loudness as the other axis. Each line on the plot represents a different volume settings level. The processor determines an audio signal level from the perceived loudness algorithm as a function of the background noise signal, one volume setting of the plurality of volume setting signals corresponding to a desired perceived loudness, and the common point. The audio signal level output is configured and arranged to provide the audio signal at a level determined by the processor.

In connection with another example embodiment, an apparatus includes a background noise input, a volume setting input, a processor and an audio signal level output. The processor is configured and arranged to determine an audio signal level for providing a perceived loudness corresponding to a volume setting signal. The processor receives a background noise signal from the background noise input and a first volume setting signal from the volume setting input. The processor determines a first linear relationship having a first slope corresponding to a first volume setting using an algorithm. Based on the background noise and the first linear relationship, the processor determines a first audio signal level for providing a first perceived loudness corresponding to the first volume setting. The processor receives a second volume setting signal from the volume setting input and determines a second linear relationship having a second slope corresponding to a second volume using the algorithm, wherein the first slope and the second slope are not equal. Based on the background noise signal and the second linear relationship a second audio signal level for providing a second perceived loudness corresponding to the second volume setting is determined. The audio signal level output is configured and arranged to provide the audio signal level determined by the processor.

In connection with another example embodiment, an audio output apparatus provides an audio signal to an output, such as a speaker, in response to different volume settings. The apparatus includes a circuit that characterizes a plurality of different linear relationships. Each linear relationship is defined as a function of a common point and a respective one of the different volume settings. The common point is the same for each of the different volume settings. The apparatus also includes a control circuit that associates a user input with one of the different volume settings. In response to a change in the level of background noise the control circuit adjusts the level of an audio signal provided to the output to maintain a perceived loudness.

In connection with another example embodiment, a method for controlling a perceived loudness of an audio output is contemplated. In a circuit implementing a perceived loudness algorithm, the method includes receiving a background noise signal and a plurality of volume setting signals, each volume setting signal corresponding to a perceived loudness. A relationship defining the algorithm implemented by the circuit is determined based on one of the volume setting signals and a common point, the common point corresponding to a particular background noise level and an audio signal level substantially. The method determines, based upon the relationship and the background noise signal, an audio signal level providing the perceived loudness corresponding to the one of the volume setting signals, and the audio signal level is outputted from the circuit.

Various embodiments include a noise adaptive playback system. The system includes an input audio signal to be adapted by the system. The background noise floor level is estimated. The noise floor represents the sum of all the background noise sources and other unwanted signals. In certain embodiments, the audio signal level, analog or digital, is also determined. The background noise may be detected by a microphone, for example. The noise floor level is provided to a volume adaptation circuit which determines a target gain for an amplifier circuit. The target gain is determined as a function of a linear equation that is selected to correspond to a particular volume setting or desired perceived sound level.

In certain embodiments, the level of the audio signal strength is also provided to a volume adaptation circuit. The audio signal can be amplified by an amplifier circuit according to a target gain. This target gain can be determined based on a linear equation chosen in response to the volume setting level and the level of the audio signal. In this manner, the noise adaptive playback system can adjust the gain of the amplifier circuit to control the audio signal level and the resulting actual sound level and thereby maintain a desired perceived sound level.

Consistent with various embodiments of the present disclosure, the noise adaptive playback system is compatible with a variety of audio devices. For example, the system can be used with a portable music player, an audio or home entertainment system, a computer, a television, a public address system, or the audio system in a car. Each device provides audio signals for producing an audio sound; however, different devices may have different audio signal levels. For instance, the audio signal level for a portable music player might be offset relative to the audio signal level for an audio system, even where both devices are otherwise providing the same song. This type of audio signal level offset or difference can arise from differences in line level signals, differences in the amplification signals and/or from differences in relative volume settings. Accordingly, certain embodiments of the present disclosure relate to the use of an audio signal level estimator to compensate for such differences. For instance, the audio signal level estimator can sense the level of the audio signal relative to a baseline level. The audio signal level can then be adjusted accordingly. This adjustment can be implemented in combination with adjustments relating to additive noise. In a particular implementation, the adjustment involves shifting, or providing an offset to, the common point as part of the compensation. Examples of such shifts to the common point are discussed in more detail herein.

In certain implementations the audio signal level estimator can be configured to compensate for differences in the audio signal from a single device. For example, digital sound files have an associated loudness and the files may have differences in their respective loudness. This can result in a perceived change in the volume setting for the device providing the audio signal when playing different files. The audio estimator allows the noise adaptive playback system to compensate for these differences so that files, or other audio sources, that are quieter than the normal level are appropriately boosted, and files that are louder than the normal level are appropriately attenuated. The audio estimator can determine the differences in a number of different manners. For instance, the audio estimator may have knowledge of the particular audio source and have stored settings for each device. The stored settings can be predetermined and/or determined during a calibration stage. In another implementation, the audio estimator keeps track of how a user adjusts the volume when switching between sources. If the user consistently changes the volume setting for a certain device, this can be indicative of the device having an audio signal level that is different than the other audio devices and an automatic change can be implemented accordingly. In certain embodiments the use of the audio signal level estimator replaces the need to normalize file volume levels before playback.

In various embodiments the audio output apparatus includes an electro-acoustic transducer (e.g., loudspeaker or headphones) and a microphone. In a particular implementation, a hands-free-communication system, such as those used in vehicles, includes such combination of a microphone and electro-acoustic transducer. The microphone can be used to detect and record the noise level. The electro-acoustic transducer can be implemented using various types of speakers, earphones and similar output devices.

Various embodiments of the present disclosure recognize that careful placement of the microphone can be useful for accurately determining the additive noise perceived by a listener. For instance, earphones that cover portions of a listener's ears can block external/additive sounds. Thus, the level of additive noise detected by an external microphone may be significantly greater than the level of additive noise that is heard by the listener. This could result in overcompensation for additive noise. Accordingly, one implementation places the microphone within the earphones such that the detected additive noise level is consistent with that heard by the users. Other implementations adjust the additive noise level by a factor associated with the use of earphones. For instance, the detected additive noise level can be reduced by a certain percentage or based upon an algorithm that models the blocking effect of the earphones.

In certain embodiments the volume adapter includes a noise calibration factor (NCF). The NCF compensates for differences in microphone sensitivity, background settings, earphones or other factors that can change. For instance, different microphones, detecting the same additive noise, can provide different signal levels. In another instance, the relationship between the microphone location and the listener's location can change (e.g., a change in audio sources can be indicative of a change in location and a corresponding change in microphone location). Thus, differences between the detected additive noise level and the actual additive noise level can be compensated by using the NCF.

Certain embodiments of the present disclosure relate to an audio calibration factor (ACF). The ACF compensates for differences in the output of an electro-acoustic transducer relative to the sound level perceived by a listener in earphone or loudspeaker sensitivity. These differences can be a result of a number of different factors including, but not limited to, differences in speakers, differences in audio amplifiers, differences in surrounding environment and differences in speaker configuration. The ACF can be used to adjust the audio signal level accordingly.

The above discussion of the present disclosure is not intended to describe each illustrated embodiment or every implementation of the present disclosure. The figures and detailed description that follow more particularly exemplify these embodiments.

The disclosure may be more completely understood in consideration of the detailed description of various embodiments of the disclosure that follows in connection with the accompanying drawings as follows.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

The present disclosure is believed to be useful for maintaining a perceived audio level output from a variety of audio sources, and the disclosure has been found to be particularly suited for use in arrangements and methods dealing with audio systems using earphones to deliver the audio output, such as cellular phones and portable music players and for use in other audio systems, including automobile stereo systems. While the present disclosure is not necessarily limited to such applications, various aspects of the disclosure may be appreciated through a discussion of various examples using these contexts.

Consistent with an example embodiment of the present disclosure, an audio output device includes a noise adaptive playback system. The device can include an audio level estimator, a background noise floor estimator, and a volume adaptation circuit or processor for determining the audio signal level adjustment to maintain the perceived loudness at a level corresponding to the volume setting. The audio signal, from an amplifier for example, is input into the noise adaptive playback unit. The background noise is recorded using, for example, a microphone.

Consistent with one implementation of the present disclosure, the audio level and the background noise level are detected on a linear scale and can be implemented without converting the detected levels from a linear scale to a decibel scale or other logarithmic scale. The background noise level and audio level are provided to a volume adaption circuit, for example. The volume adapter circuit determines a target gain to be applied to the audio signal based on a linear equation. The linear equation can be described by a common point and the volume setting. The common point, or convergence point, is the point where all of the lines representing a constant perceived loudness for a given volume setting converge. In other words, the common point can be represented by a noise level at which an audio signal level that is the same regardless of the volume setting.

In certain implementations, the volume can be set by a user, or by a computer, for example. The volume adapter circuit outputs a signal which corresponds to a target gain to be applied to the audio signal. Various circuits, e.g., a transistor, can be used to increase (or decrease) the audio signal level by the specified amount prior to generating actual sound through electro-acoustic transducers.

In certain embodiments of the present invention, an algorithm is implemented by a computer. The computer uses the algorithm to determine a target gain to be applied to the audio signal. The algorithm uses an equation derived from a common point and a volume setting. In certain embodiments the equation is a linear equation. In other embodiments of the present disclosure a noise calibration factor (NCF) and/or an audio calibration factor (ACF) are included in the algorithm. The NCF compensates for differences in microphone sensitivity between different microphones. In the same ambient noise conditions, different microphones record different levels depending on the microphone sensitivity. The noise level can be multiplied by the NCF. In certain embodiments the NCF is defined so that a noise level of 1 corresponds to a predefined perceived loudness of the ambient noise. For example, a NCF may be chosen such that a noise level of 1 corresponds to 90 dB SPL (sound pressure level). The ACF compensates for differences in earphone or speaker sensitivity. The same input audio signal to different earphones or speakers may deliver an output with a different loudness level. To compensate for the deviations in output, the audio signal level can be multiplied by the ACF. The ACF is defined so that an audio level of 1 corresponds to a predefined perceived loudness of the audio signal. For example, an ACF may be chosen such that an audio level of 1 corresponds to 90 dB SPL.

Figure 1:
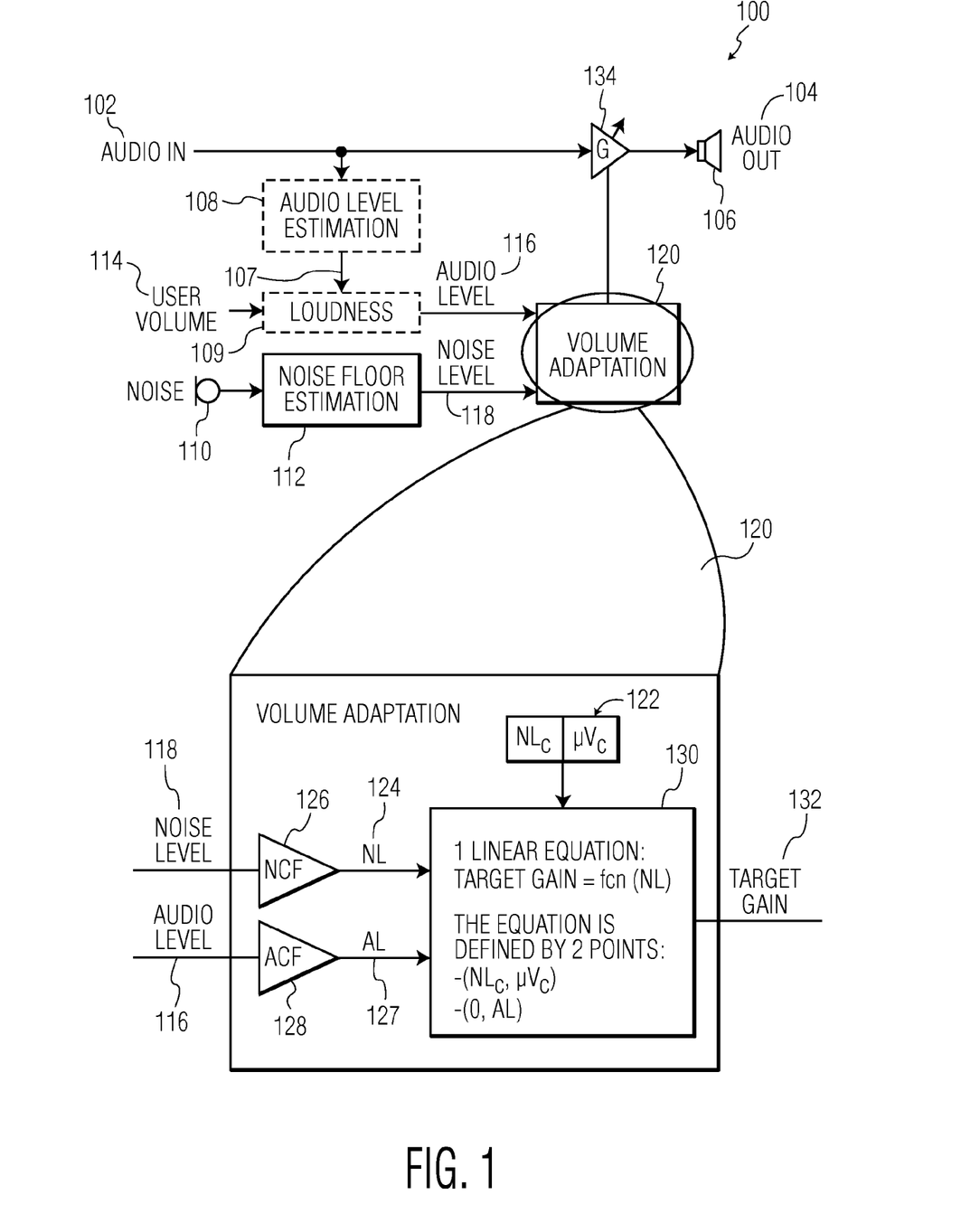
FIG. 1 depicts an audio output apparatus for maintaining a perceived loudness, consistent with an embodiment of the present disclosure.

Turning to the figures, FIG. 1 depicts an audio output apparatus 100 for providing an audio output. In response to receiving an input audio signal 102, from an audio source, the apparatus 100 is used to maintain a perceived audio level in the audio sound output 104 of the device. The optional audio level estimator 108 estimates the level of the input audio signal 102, resulting in audio signal level 107. The audio signal level 107 is multiplied by the user set volume 114 in optional loudness circuit 109, resulting in corrected audio signal level 116. The background noise detector 110 detects the background noise and the noise floor estimator 112 estimates the level of background noise, resulting in noise signal level 118. The noise signal level 118 and the corrected audio signal level 116 are input into the volume adaptation unit 120. In embodiments without audio level estimator 108 and loudness circuit 109, volume setting 114 alone is used to determine the audio signal level 116 inputted into the volume adaptation unit 120.

The volume adaptation unit 120 implements an algorithm 130 that uses the corrected audio signal level 116 and the noise signal level 118. In certain embodiments the algorithm 130 can be implemented using a computer, a special purpose processor, configured logic, discreet logic, or any combination thereof, for example. The algorithm 130 includes, as an input, the coordinates of the common point 122. In embodiments with audio level estimator 108 and loudness circuit 109, the algorithm 130 uses the common point 122 along with the corrected audio signal level 116 to create a linear relationship. The linear relationship represents the strength of output audio sound 104 needed to maintain a perceived loudness corresponding to corrected audio signal level 116 for a given level of background noise 118. In embodiments without audio level estimator 108 and loudness circuit 109, the algorithm 130 uses the common point 122 along with volume setting 114 to create a linear relationship. The linear relationship represents the strength of output audio sound 104 needed to maintain a perceived loudness corresponding to the volume setting 114. The algorithm 130 is used to determine, based on the background noise level 118, the target gain 132 that maintains the desired perceived loudness. This determined target gain 132 is then provided to adjustable amplifier 134. The amplifier 134 adjusts the input audio signal 102 to the desired level (strength) prior to providing the signal to output device 106.

The volume adaptation unit 120 can include an NCF 126 and an ACF 128 in certain embodiments of the present disclosure. When the NCF 126 is present, the noise signal level 118 is multiplied by the NCF 126 resulting in a corrected noise signal level 124. When the ACF 128 is present, the audio signal level 116 is multiplied by the ACF resulting in a corrected signal level 127. When the NCF 126 and/or the ACF 128 are present, the corrected signals 124 and/or 127 are provided to the algorithm 130.

Output device 106 can be an electro-acoustic transducer or speaker. Example speakers can include, but are not limited to, car stereo speakers, a home theater speakers, or earphones. The input audio 102 can come from a stereo amplifier, a portable music player, a car stereo, or a cellular phone, for example. In other embodiments the audio signal can come from a device with functionality in addition to audio, such as a television.

Figure 2:
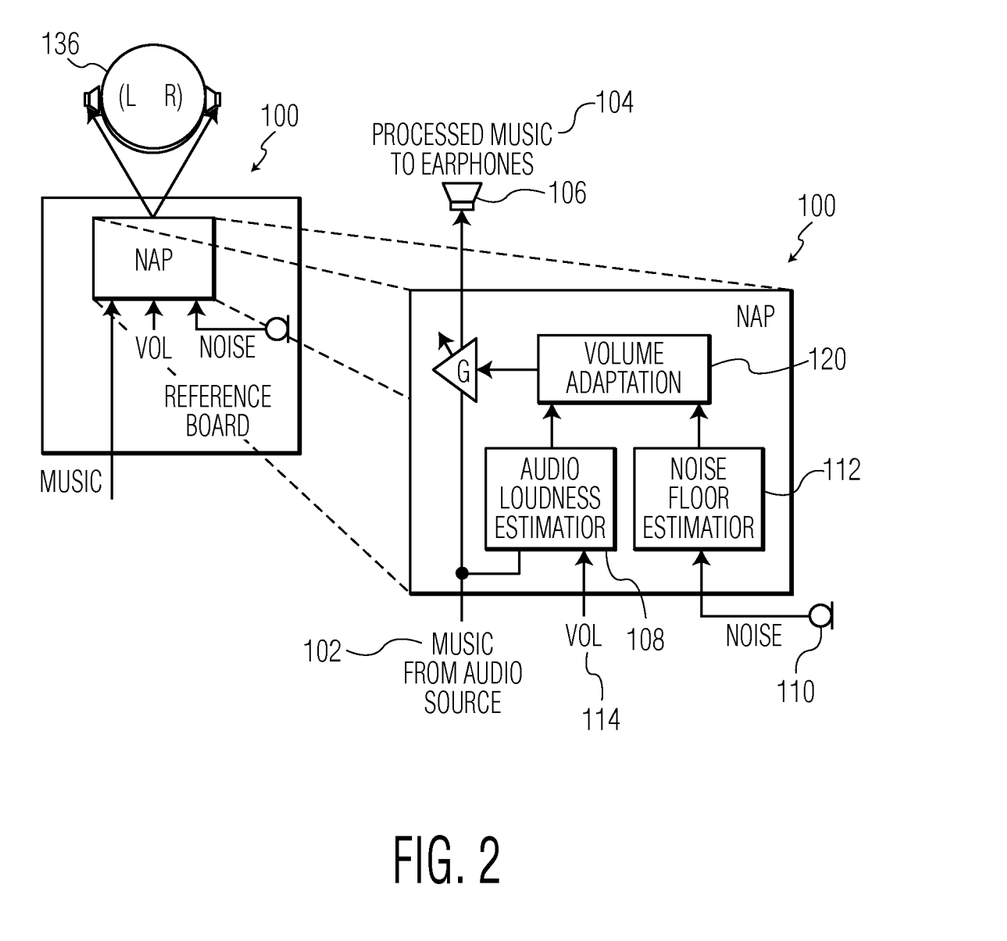
FIG. 2 depicts an audio output apparatus for use with earphones, consistent with an embodiment of the present disclosure.

FIG. 2 depicts an embodiment of the present disclosure where a noise adaptive playback device 100 is used with output device 106 is a set of earphones, for example. The user 136 sets a volume setting 114. The input audio signal 102 comes from an audio source such as a portable music player. The input audio signal 102 is sampled by audio loudness estimator 108 to estimate the loudness level of the input audio signal 102. Background noise detector 110 provides a signal to a noise floor estimator 112. The resulting noise signal level and the audio signal level are provided to the volume adaptation unit 120.

Figure 3:
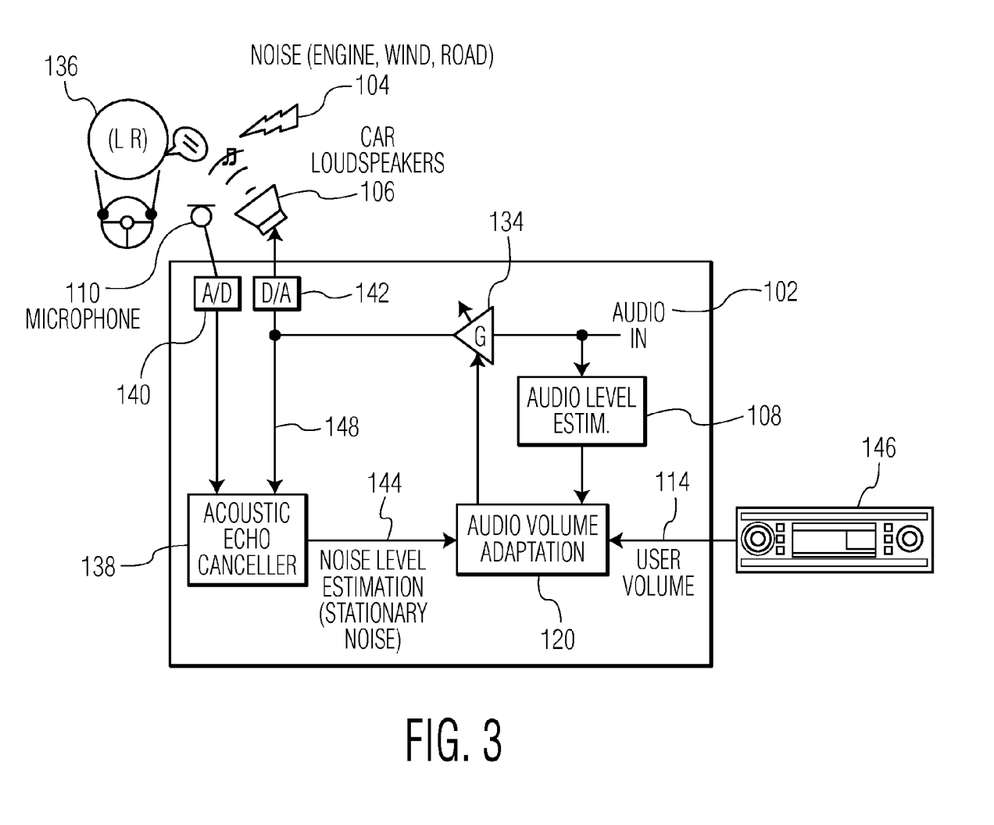
FIG. 3 depicts an audio output apparatus for use with loudspeakers, consistent with an embodiment of the present disclosure.

FIG. 3 depicts an embodiment of the present disclosure where a noise adaptive playback device 100 is implemented for use with a car sound system. The user 136 sets a volume setting 114 through stereo interface 146. The background noise detector 110 (e.g., an electro-acoustic transducer or microphone) detects the additive noise level. In certain embodiments, the microphone 110 is not dedicated solely for use as a background noise detector. For example, microphone 110 can be part of a car's hands-free communication system. Acoustic echo canceller 138 receives a signal from the microphone 110 and A/D converter 140 that includes both the ambient noise and the echo from the audio signal that is played back through the speakers. The canceller 138 also receives the adjusted audio signal 148. The canceller 138 outputs an estimate of the background noise level 144, which is provided to the volume adaptation unit 120. D/A converter 142 converts the digital audio output signal to an analog signal prior to providing the signal to output device 106 in a car loudspeaker, for example. An output audio signal 104 is provided to the user 136 that maintains a constant perceived loudness associated with the user set volume level.

Figure 4:
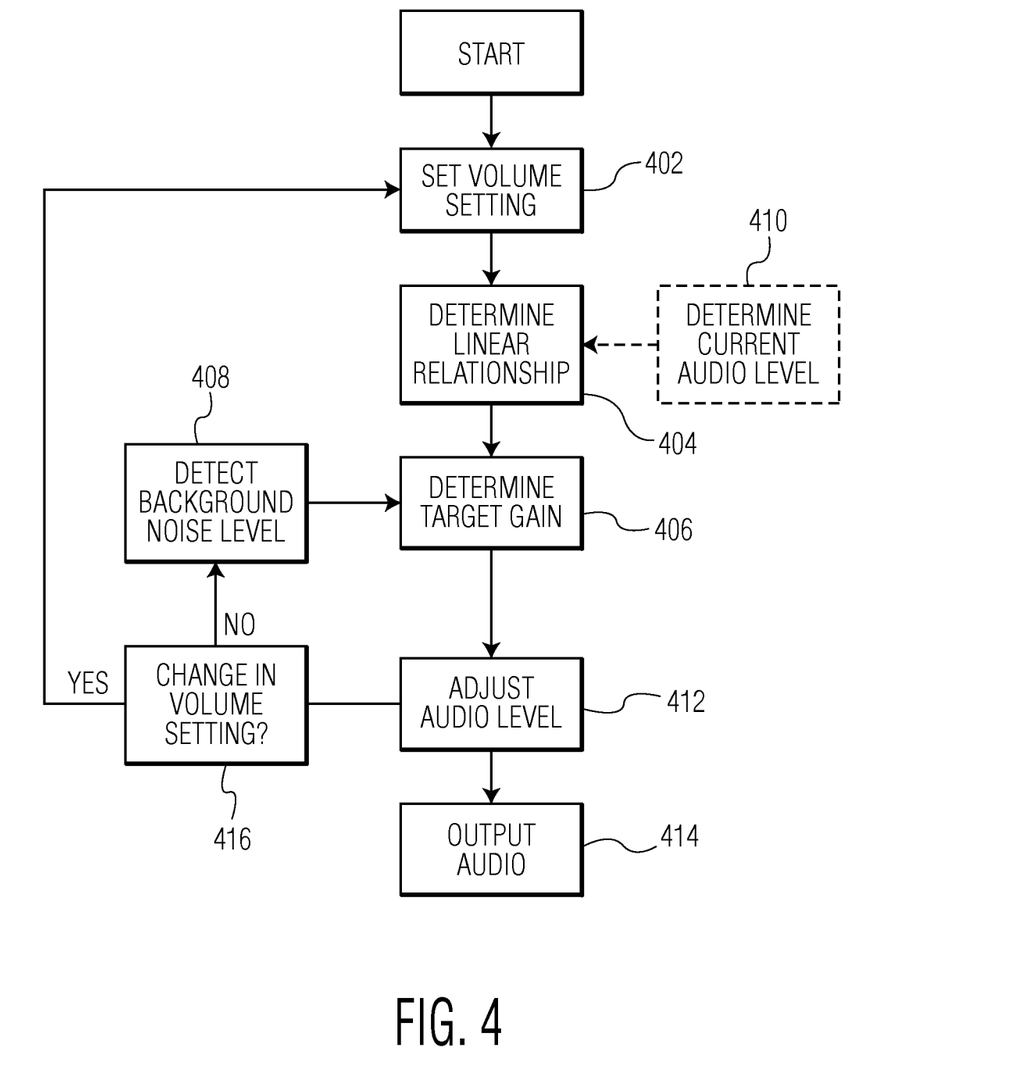
FIG. 4 depicts a flow chart consistent with an embodiment of the present disclosure.

FIG. 4 depicts a flow chart for maintaining a perceived loudness, consistent with an embodiment of the present disclosure. The process depicted in FIG. 4 can be used, for example, with noise adaptive playback device 100. A volume setting corresponding to an audio signal level is set in step 402. The volume setting and resulting audio signal level correspond to the desired perceived loudness to be maintained by the system. A linear relationship between an sound output level and the additive noise level is determined in step 404 based on the volume setting from step 402. This can be done by, for example, creating an equation based on the volume setting and a common point, which can be quickly calculated, predetermined and/or stored at step 404 in a lookup table. The equation chosen corresponds to the volume setting from step 402.

A target gain is determined in step 406. The determination is made based on the linear relationship determined in step 404, and a background noise level, which is detected in step 408 and, in certain embodiments, a current audio signal level, which is determined in step 410. If the volume setting or the current audio signal level changes, the linear relationship from step 404 changes. If the linear relationship, or background noise level change, then a new target gain is determined. In embodiments including (optional) step 410, the value provided to step 406 relating to the volume setting is a function of the audio signal as well. In embodiments including step 410, the audio signal level is used in addition to the volume setting to determine the linear relationship. The inclusion of step 410 allows the system to adjust for differences in the audio signal strength. For example, a device implementing this method may receive audio signals from different input devices each having a different line level. The target gain is determined in step 406 applying the background noise level to the linear relationship from step 404. The output of the linear relationship is the audio signal level needed to maintain the perceived audio level corresponding to the volume setting from step 402. In step 412 the audio signal level is adjusted based on the determination from step 406. Finally, the newly adjusted audio signal level is outputted from the system in step 414. Step 416 determines whether the initial volume setting has been changed by the user. If the volume setting has been changed by the user, then the entire process begins again, starting with determining the volume setting at step 402. If step 416 determines no change in volume setting has occurred, then steps 408, 406, 412 and 414 can be repeated as long as the system is on. In certain embodiments including determining the current audio signal level, step 410 is repeated, regardless of the outcome at step 416. If in step 416 it is determined that the initial volume setting has changed, then steps 402 and 404 are repeated as prior to steps 408, 406, 412 and 414.

Figure 5A:
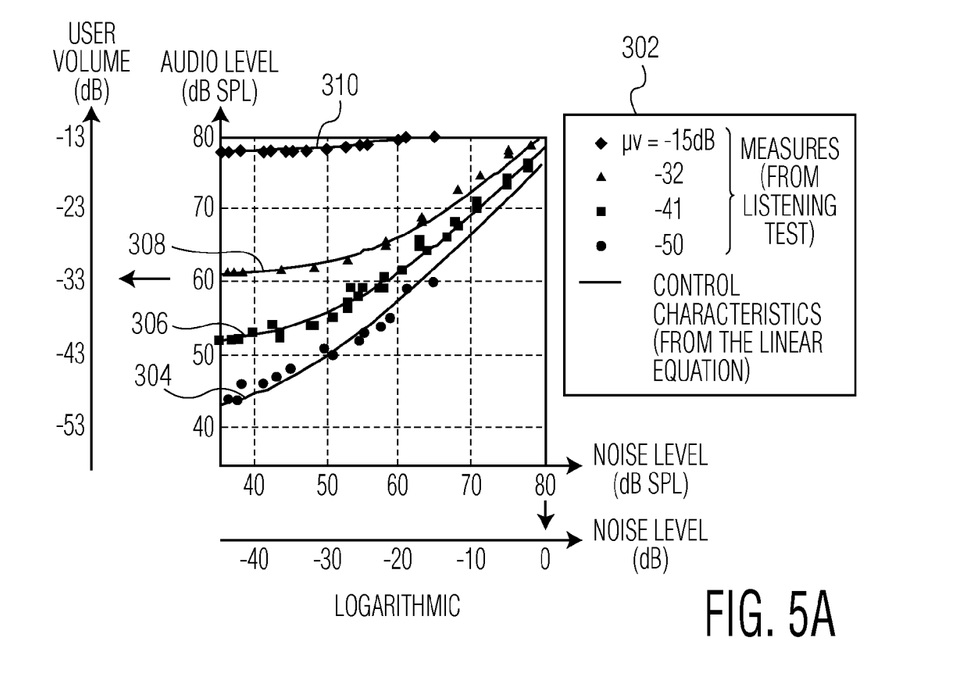
FIGS. 5A and 5B depict experimental data showing the relationship between audio level and noise level to maintain a constant perceived loudness, consistent with an embodiment of the present disclosure.

FIG. 5A depicts the results of experimental data from perceived loudness tests. The perceived loudness tests were implemented by having users set an initial volume for a device. The users were then asked to adjust the volume to maintain the perceived loudness of the device as background noise was increased. The volume setting users indicated necessary for maintaining the perceived loudness (relative to the initial volume setting) model closely the predicted values from the equation, and vice versa. FIG. 5A displays the information on a logarithmic graph, with audio level and noise level in dB SPL. Data points 304, 306, 308 and 310 are plotted on the graph and each point represents experimental data from listeners. Data points 304 correspond to an initial volume of −50 dB and are represented on the graphs by circles. Data points 306 correspond to an initial volume of −41 dB and are represented by squares. Data points 308 correspond to an initial volume of −32 dB and are represented by triangles. Data points 310 correspond to an initial volume of −15 dB and are represented by diamonds. FIG. 5A shows how closely the predicted values, as depicted by curves 302, conform to the data 304, 306, 308 and 310. The amount the audio level needs to be increased for a given increase in noise level is different for each curve.

Figure 5B:
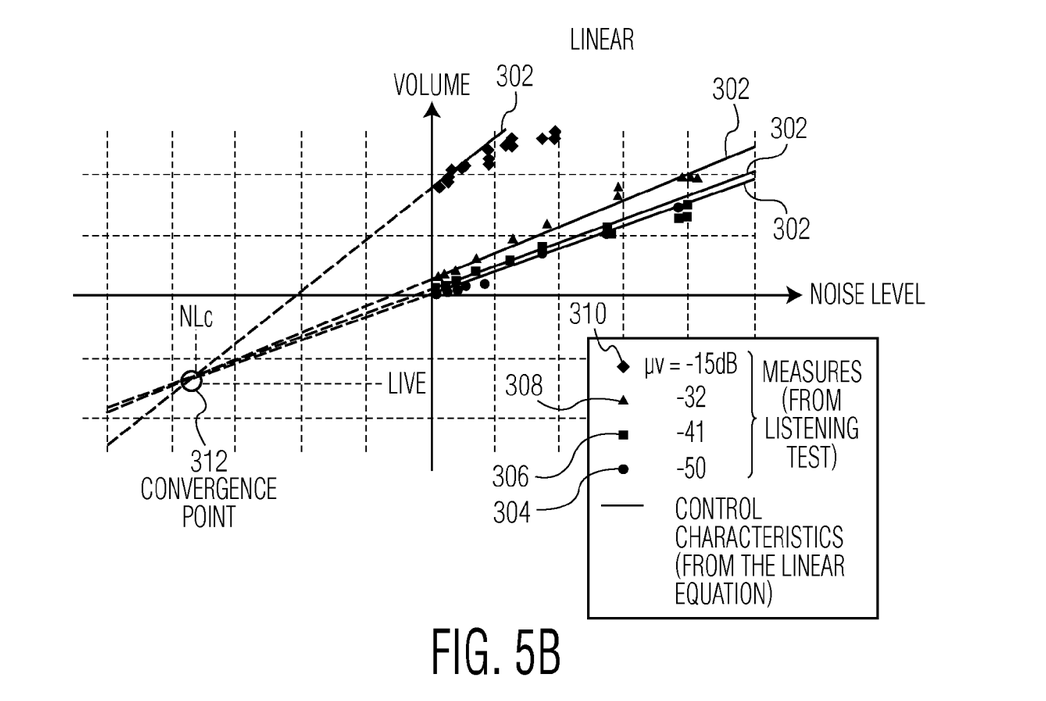
Figure 6A:
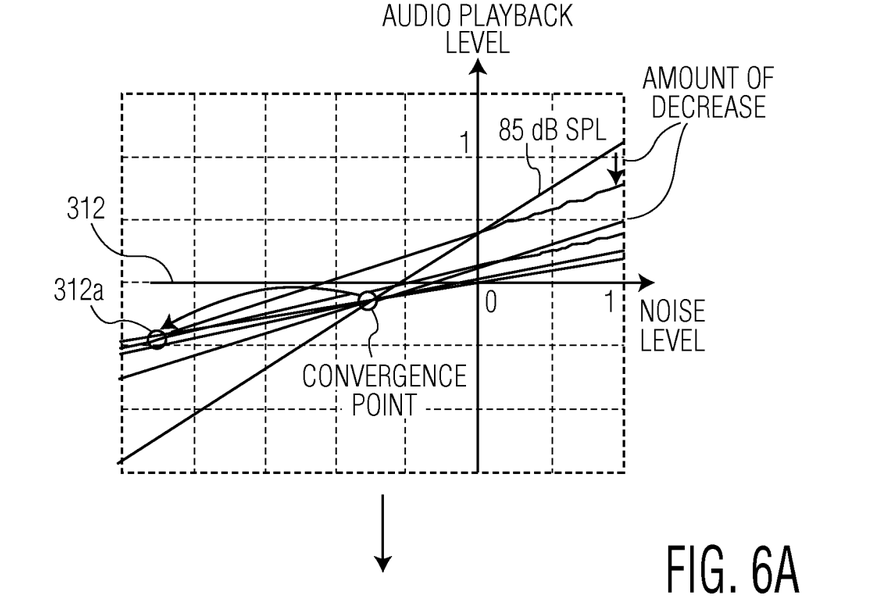
FIGS. 6A, 6B, 7A and 7B depict the effects of moving the common point, consistent with an embodiment of the present disclosure.
Figure 6B:
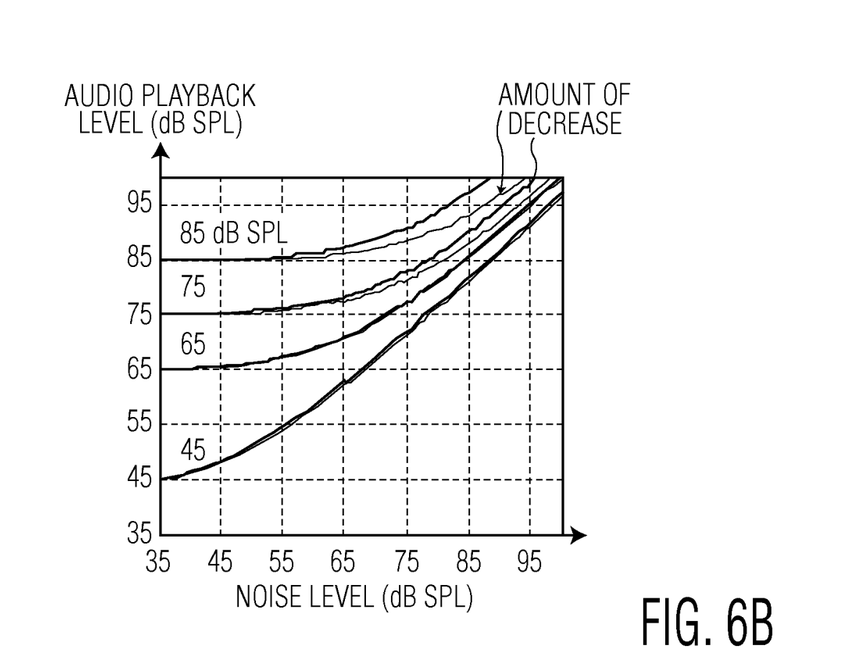

FIG. 5B depicts the same data points 304, 306, 308 and 310 on a linear graph. The noise signal level and audio signal/volume level are set to range from 0 to 1, for example, where 0 equals the first (e.g., lowest) audible background noise signal level or audio signal/volume level and 1 equals the last (e.g., maximum) background noise level or audio signal/volume level. The expected control characteristics, as predicted by the linear equation, are again shown by lines 302 for each different starting volume setting. The graph also shows the convergence point or common point 312. The point is characterized by being the point where all of the lines 302 converge. This point can be determined, in part, through experimental tests of the audio signal level needed to maintain a perceived loudness in the presence of increasing background noise. The lines diverging from this single common point 312 fit the expected result for the listening test in decibels. The common point 312 can be provided to an audio output apparatus so that linear equations representing the relationship between audio signal level and background noise to maintain perceived loudness can be generated for a given volume setting. In certain embodiments of the present disclosure this can be useful for reducing the amount of storage space since a different equation and/or full set of audio signal level values do not need to be stored for each volume setting. For instance, rather than storing a full-set of values for each combination of volume setting and current background noise in a look-up table, a single algorithm can be used to determine values for all signal settings and background noise levels.

The common point 312 has a value, UVc, which is associated with volume or audio level. In the graph in FIG. 5B this is on the y axis. The common point 312 also has a value, NLc which is equal to the x value of the point on the graph in FIG. 5B, and which is associated with background noise. The linear equation consistent with various embodiments of the present disclosure can be generated using UVc and NLc, along with the volume setting, UVi. The equation can be described as:

$$y = \frac{UVc - UVi}{NLc} X + UVi.$$

The slope of a curve to maintain perceived loudness, consistent with an embodiment of the present disclosure, is the value of the common point associated with volume or audio signal level, minus the volume setting over the value of the common point associated with background noise level.

FIGS. 6A, 6B, 7A and 7B depict the effects of changing the convergence point 312 in various ways. In certain embodiments of the present disclosure it can be desirable to allow the user to adjust the convergence point based on the user's preferences. For instance, individuals have different hearing capabilities and associated preferences. In a particular implementation, the convergence point can be moved relative to a linear relationship for a particular/selected desired perceived sound level. Depending on the particular desired perceived sound level that is selected, the movement of the convergence point has different relative effects on higher or lower initial volume setting curves. For example, in FIG. 6A, the common point 312a was moved from the convergence point 312 along one of the lower initial volume level curves (e.g., at or near 45 dB). This move does not affect the slope of the curve along which the common point 312a was moved. The curves/lines for initial volumes close to the initial volume of the selected curve of the common point 312a was moved along see only a relatively small change; however, an increasingly larger change is seen as the difference in initial volumes increases. In the example depicted in FIGS. 6A and 6B the amount of change in the audio level for the 85 dB curve is decreased for a given background noise level. This decreases the amount of gain applied to the audio playback level for the 85 dB line curve, while little or no change in the gain has occurred to the 45 dB curve. The decrease in gain for the 85 dB curve results in a sound level, which may represent a lower perceived sound level.

Figure 7A:
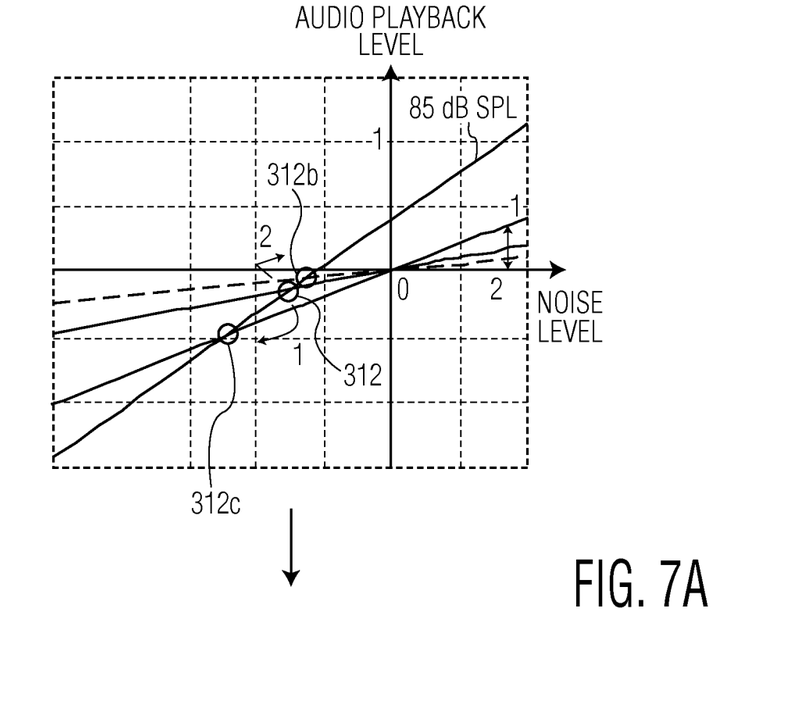
Figure 7B:
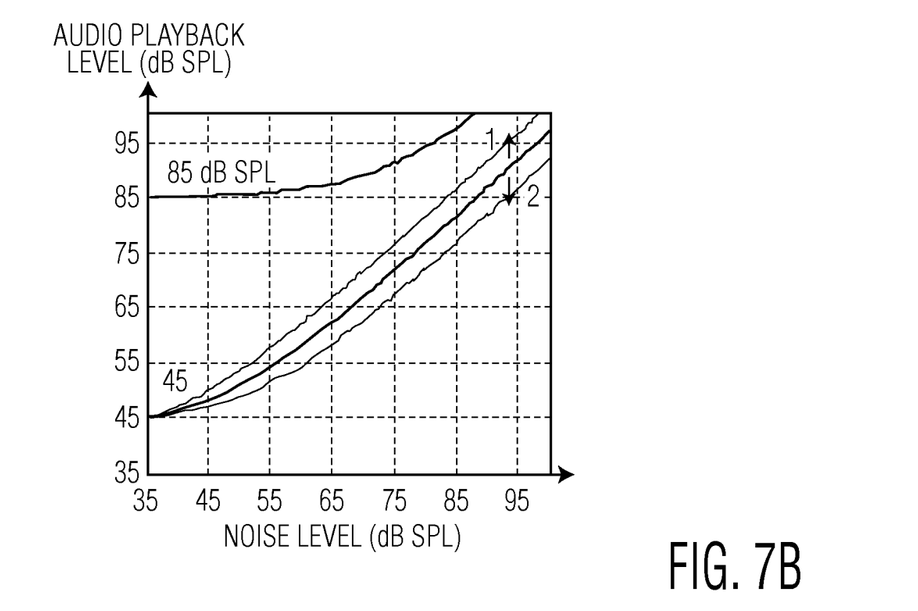

FIGS. 7A and 7B depict movement of the convergence point 312 along a high initial volume curve, in this case the 85 dB curve. Moving the convergence point to common point 312c at point 1 results in an increase in the gain applied to the audio playback level for low audio perceived loudness. Moving the convergence point to common point 312b at point 2 results in a decrease in the gain applied to the audio playback level for low audio perceived loudness.

The convergence point can also be shifted independent of the various linear relationships. This can result in a change to all of the various linear relationships. Thus, the output values can all be shifted up or down relative to increases in additive noise levels.

Various embodiments of the present disclosure relate to this and other shifting of the common point. This can be useful for an individual user to correct for differences in personal perception of audio signal loudness, for differences in audio source types (e.g., a music setting versus a mobile telephone call setting) or for a variety of other user preferences. For instance, an automobile application could allow different drivers to adjust the common point to suit their personal preferences. The individual preferences could then be stored and accessed for each driver. This could be applied to various other applications where there are several different users of the device.

Various embodiments of the noise adaptive playback system can shift the common point based on the source of (or type of) sound being presented. For example, some sources, such as a book on tape, a mobile telephone or driving directions, may have a high importance to a listener than other sources, such as background music. A listener therefore may wish to shift the common point for some sources/types of sound but not for others. In certain embodiments the listener can store various common points for different sources of sound. Each stored common point can represent a boost preference for a given source/type of sound. The noise adaptive playback system can include various types of inputs allowing a user to shift the common point. For example, the system can include an interface through which a user can select a common point based on desired boost characteristics.

Various embodiments of the present disclosure can be implemented in a variety of audio producing systems. For example, the noise adaptive playback apparatus can be implemented with a portable music player, a cellular phone, a car stereo system, a home stereo system, a television, or a public address system. This list is not limiting, but rather illustrates some of the wide range of audio systems with which the noise adaptive playback apparatus may be used.

In implementing the noise adaptive playback apparatus a microphone can be used to detect noise levels. In certain embodiments the noise detector detects the decibel level of the background noise. In embodiments where the noise or audio level is detected in decibels, the levels are converted from decibels to a linear scale. The linear scale can go from 0 to 1, with 0 being the lowest possible noise level and 1 being the highest possible noise level. The values 0 and 1 are arbitrary values and other values can be used in their place.

The circuit-implemented systems and methods discussed herein can include one or more of: discrete logic circuitry, programmable logic arrays, specialized processors or general purpose processors specifically programmed. Combinations of these and other circuit elements are also possible and within the scope of various embodiments of the present disclosure. For example, systems consistent with the aspects shown in the figures could be implemented in a variety of circuit-based forms, such as through use of data processing circuit modules. More specifically, such systems are exemplified by implementation in high-speed programmable computer/processor circuits that execute stored instructions to provide operations corresponding to the various blocks of the figures. Alternatively, such a computer/processor could be implemented in combination with discrete and/or semi-programmable circuitry (e.g., as Field-Programmable Gate Arrays, Programmable Logic Devices/Arrays). Also various ones of the illustrated blocks, and those functions discussed in text, can be implemented using integrated and nonintegrated approaches, e.g., with certain ones of the blocks located remotely and/or operated disparately relative to the other blocks.

Various embodiments described above and shown in the figures may be implemented together and/or in other manners. One or more of the items depicted in the drawings/figures can also be implemented in a more separated or integrated manner, or removed and/or rendered as inoperable in certain cases, as is useful in accordance with particular applications. For example, embodiments involving an acoustic echo canceller are particularly useful where the desired signal needs to be separated from the background noise signal. In view of the description herein, those skilled in the art will recognize that many changes may be made thereto without departing from the spirit and scope of the present disclosure.

What is claimed:

1. An apparatus comprising:
  a processor circuit configured and arranged to
    determine, for a perceived loudness algorithm that outputs audio signal levels, a common point corresponding to a particular background noise level at which the levels of the audio signal levels are independent of a volume setting that corresponds to desired perceived loudness, and
    determine an audio signal level from the perceived loudness algorithm in response to a background noise signal, a volume setting signal, and the common point; and
  an audio signal level output circuit configured and arranged to provide an audio signal at the determined audio signal level.

2. The apparatus of claim 1, wherein the audio signal level output circuit includes an adjustable amplifier configured and arranged to amplify the audio signal based on the audio signal level output.

3. The apparatus of claim 1, further comprising a background noise detector circuit configured and arranged to detect a background noise floor and to provide a signal indicating the detected background noise floor to the background noise input.

4. The apparatus of claim 1, wherein the processor circuit is further configured and arranged to access a common point offset from a look up table including multiple common points, the common point offset chosen based on a signal from a boost preference input.

5. The apparatus of claim 1, wherein the processor circuit is further configured and arranged to determine the audio signal level by determining a linear relationship based on the background noise level corresponding to the common point, a common point audio signal level corresponding to the common point, and a baseline audio signal level corresponding to the desired perceived loudness when no background noise is present; and
  determining from the linear relationship, using the background noise signal as an input into the linear relationship, an audio signal level corresponding to the desired perceived loudness in the presence of the background noise signal.

6. The apparatus of claim 1, further comprising a speaker receiving an input audio signal at the audio signal level determined by the processor.

7. The apparatus of claim 1, further comprising
  a user input configured and arranged to receive a user-defined volume signal;
  an audio level estimator for estimating an input audio signal level from an audio source signal; and
  a loudness determiner, the loudness determiner configured and arranged to receive the input audio signal level from the audio level estimator and the user defined volume signal, and to determine the volume setting signal to be provided to the volume setting input based upon the received input audio signal level and the user defined volume signal.

8. The apparatus of claim 1, further comprising an audio correction unit configured and arranged to adjust an input audio signal strength based on characteristics of a device providing an input audio signal.

9. The apparatus of claim 1, further comprising a noise correction unit configured and arranged to adjust the background noise signal based on characteristics of a background noise detector that provides the background noise signal to the background noise input.

10. An apparatus comprising:
  a processor circuit configured and arranged to determine an audio signal level for providing a perceived loudness corresponding to a volume setting signal by
    determining, using an algorithm, a first linear relationship having a first slope corresponding to a first volume setting,
    determining, based on the background noise signal and the first linear relationship, a first audio signal level for providing a perceived loudness corresponding to the first volume setting,
    determining, using the algorithm, a second linear relationship having a second slope corresponding to a second volume setting, wherein the first slope and the second slope are not equal, determining, based on the background noise signal and the second linear relationship, a second audio signal level for providing a perceived loudness corresponding to the second volume setting; and an audio signal level output configured and arranged to provide the audio signal level determined by the processor.

11. The apparatus of claim 10, wherein the first linear relationship and the second linear relationship include a common point, the common point corresponding to a particular background noise level and an audio signal level that is independent of the volume settings.

12. The apparatus of claim 11, wherein determining a first linear relationship includes determining a slope between the common point and a second point at the first volume setting and at a background noise level corresponding to an inaudible background noise.

13. The apparatus of claim 10, further comprising an audio input device configured and arranged to provide an input audio signal, an adjustable amplifier configured and arranged to adjust a gain of adjustable amplifier in response to the audio signal level from the audio signal level output; and an electro-acoustic transducer configured and arranged to output sound in response to the output of the adjustable amplifier.

14. The apparatus of claim 13, wherein the electro-acoustic transducer is a speaker and the audio input device is a stereo system.

15. The apparatus of claim 13, wherein the electro-acoustic transducer is a set of earphones and the audio input is a portable music player.

16. A method comprising:

in a circuit implementing a perceived loudness algorithm:

receiving a background noise signal and a plurality of volume setting signals, each volume setting signal corresponding to a perceived loudness;

determining a relationship, defining the algorithm implemented by the circuit, based on one of the volume setting signals and a common point corresponding to a particular background noise level and an audio signal level substantially independent of the volume setting signals;

determining, based on the relationship and the background noise signal, an audio signal level providing the perceived loudness corresponding to the one of the volume setting signals; and outputting the audio signal level.

17. The method of claim 16, further comprising adjusting an input audio signal strength based on the audio signal level.

18. The method of claim 16, wherein the common point is stored by the circuit, and further comprising adjusting the common point to achieve a desired audio signal level different than the audio signal level corresponding to the perceived loudness.

19. The method of claim 16, further comprising determining a background noise level corresponding to the background noise signal.

20. The method of claim 16, further comprising determining a file type for an input audio signal and adjusting the common point based on stored preferences corresponding to the file type.

21. The method of claim 16, wherein determining a relationship includes:

determining a linear relationship based on the common point's background noise level and audio signal level, and the volume setting signal's audio signal level and zero background noise, wherein the volume setting signal's audio signal level corresponds to the desired perceived loudness when no background noise is present; and wherein determining the audio signal level includes determining from the linear relationship, using the background noise signal as an input into the linear relationship, the audio signal level corresponding to the desired perceived loudness in the presence of the background noise signal.

22. The method of claim 16, further comprising receiving a user defined volume signal;

using an audio level estimator to determine an input audio signal level for an input audio signal;

determining a loudness signal based on the input audio signal level and the user defined volume signal; and using the loudness signal as a volume setting signal to determine the relationship defining the algorithm implemented by the circuit.

* * * * *